United States Patent [19]

Dougherty

[11] Patent Number: 4,876,516
[45] Date of Patent: Oct. 24, 1989

[54] HIGH GAIN DISTRIBUTED AMPLIFIERS

[75] Inventor: Richard M. Dougherty, Scottsdale, Ariz.

[73] Assignee: Motorola, Inc., Schaumburg, Ill.

[21] Appl. No.: 302,525

[22] Filed: Jan. 27, 1989

[51] Int. Cl.[4] .............................................. H03F 3/60
[52] U.S. Cl. ..................................... 330/54; 330/277
[58] Field of Search ......................... 330/54, 277, 286

[56] References Cited

U.S. PATENT DOCUMENTS

| 3,986,133 | 10/1976 | Roza et al. | 330/306 |
|---|---|---|---|
| 4,359,695 | 1/1982 | Gerard | 330/151 |
| 4,486,719 | 12/1984 | Ayasli | 330/286 |
| 4,595,881 | 6/1986 | Kennan | 330/54 |
| 4,771,196 | 9/1988 | Mead et al. | 307/605 |

Primary Examiner—James B. Mullins
Attorney, Agent, or Firm—Jordan C. Powell

[57] ABSTRACT

A distributed amplifier which increases gain by increasing transconductance comprises a plurality of amplifying elements. Each element includes a darlington amplifier connected in cascade with a FET (field effect transistor) amplifier. The darlington amplifier includes an RC (resistance/capacitance) feedback loop from the drain to the gate. Each of the amplifying elements are coupled in parallel between an input transmission line and an output transmission line. The output transmission line operates as a recombining network as the input signals pass through the amplifying elements. To further increase gain and power output, a time delay line is coupled to each end of the output transmission line. The time delay line simulates the terminating elements normally associated with distributed amplifiers, and collects unguided signals from the output transmission line to recombine them with guided signals at the output. These unguided signals are terminated in conventional distributed amplifiers resulting in approximately a 3 dB (decibel) loss in gain. Recombining the unguided signals with guided signals at the output preserves the 3 dB gain the output transmission line for an overall output increase in gain. The time delay line provides the means for increasing second and third order intercept points of the amplifier by recombining the unguided signals with the guided signals.

11 Claims, 4 Drawing Sheets

HIGH GAIN DISTRIBUTED AMPLIFIERS

BACKGROUND OF THE INVENTION

This invention relates, in general, to field effect transistor (FET) distributed amplifiers, and more specifically, to FET distributed amplifiers with high gain and broad band widths.

Distributed amplifiers incorporate a series of amplifiers coupled in parallel to an input transmission line. Each of the amplifiers receives a portion of an RF (radio frequency) signal, or other type of signal, and amplify that particular portion of signal. The amplified signals output by the respective amplifiers are then combined to yield an output with high gain and high power output with respect to power input. A problem inherent within these distributed amplifiers is a loss of approximately 3 dB (decibals) through terminating what is known as unguided signals. When the respective amplifiers of the distributed amplifier output the amplified signals to the output transmission line, the amplified signals are split with part transmitted to the output (guided portion), and the other part, or unguided signals, terminated. Termination of the unguided signals results in the 3 dB loss.

Gain of a distributed amplifier can be approximated by the following equation:

$$\text{Gain}(G) = 20 \, \text{Log}(N \, g_m \, Z_o)/2$$

where
- N = number of distributed amplifier devices,
- $g_m$ = transconductance,
- $Z_o$ = transmission line impedance, and G is bounded by the maximum device gain. Since increasing N results in diminishing returns on power (due to increased line losses), G can effectively be increased only by increasing $g_m$. Many networks designed to increase G have increased N with partial success, but such devices become unuseable after the number of active devices exceed three for the reasons explained above. Furthermore, increasing the number of devices increases the cost of the amplifier since the size of the amplifier increases with each device added. This is particularly a problem with amplifiers designed for MMIC (monolithic microwave integrated circuits) technology where size is to be minimized to increase yields. Some designs have attempted to increase $g_m$, but have achieved only partial success.

SUMMARY OF THE INVENTION

Accordingly, it is an object of the present invention to provide a distributed amplifier having increased gain and power output.

Another object of the present invention is to provide a larger bandwidth distributed amplifier with increased gain and decreased size by increasing the transconductance of the device rather than increasing the number of devices.

To increase G by increasing $g_m$, while decreasing the size of the distributed amplifier, an improved distributed amplifier is provided comprising a plurality of amplifying elements. Each element includes a darlington amplifier cascaded with a FET (field effect transistor) amplifier. The darlington amplifier includes an RC (resistance/capacitance) feedback loop from the drain to the gate. Each of the amplifying elements are coupled in parallel between an input transmission line and an output transmission line. The output transmission line operates as a combining filter as the input signals pass through the amplifying elements. To further increase G and power output, a time delay line is coupled to each end of the output transmission line. The time delay line simulates the terminating elements normally associated with distributed amplifiers, and collects unguided signals from the output transmission line to recombine them with guided signals at the output. These unguided signals are terminated in conventional distributed amplifiers resulting in approximately a 3 dB loss in G. Recombining the unguided signals with guided signals at the output preserves the 3 dB gain in the output transmission line for an overall output increase in G. The time delay line provides the means for increasing second and third order intercept points of the amplifier by recombining the unguided signals with the guided signals.

The above and other objects, features, and advantages of the present invention will be better understood from the following detailed description taken in conjunction with the accompanying drawings.

DETAILED DESCRIPTION OF THE INVENTION

Figure 1:
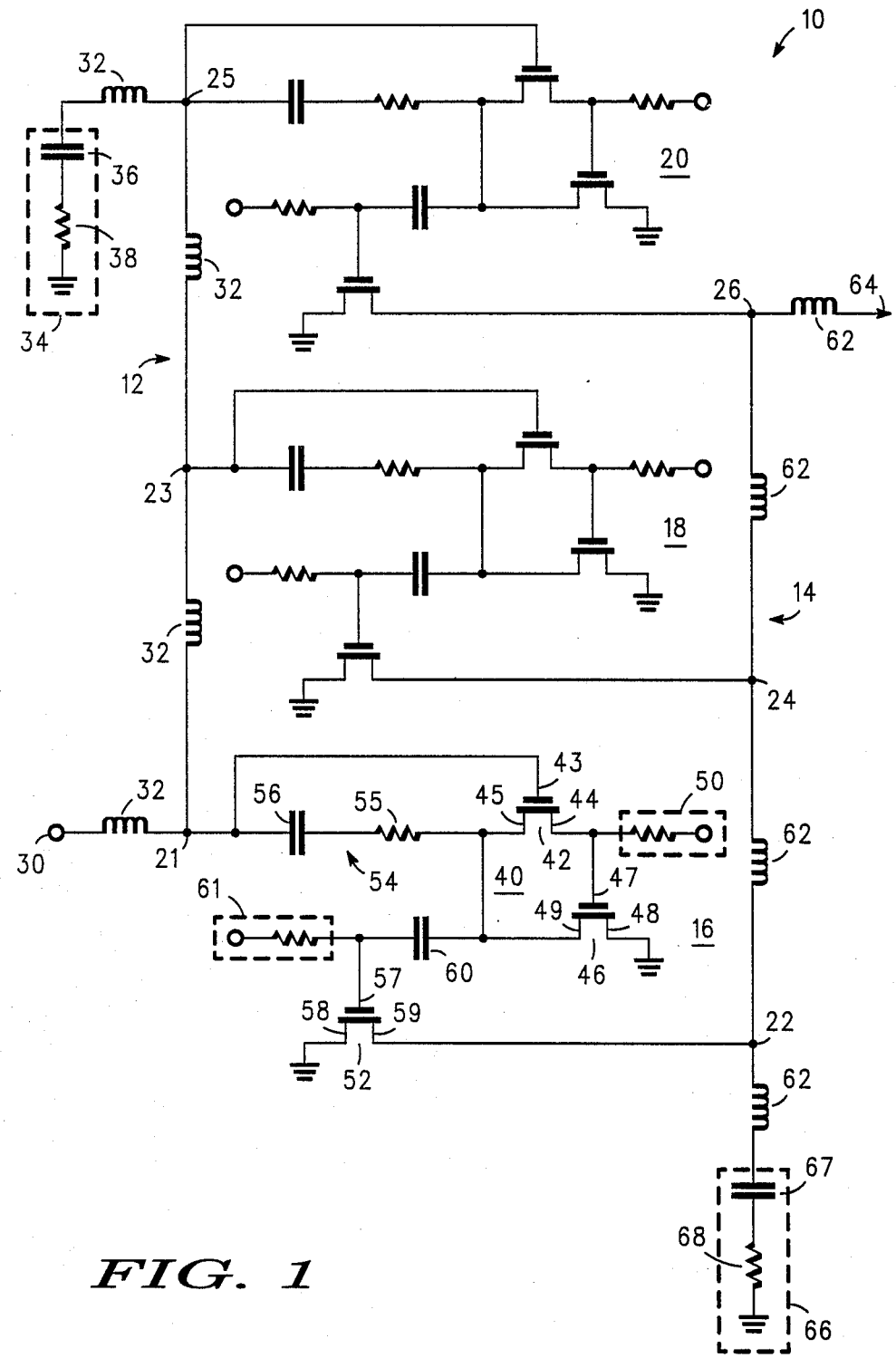
FIG. 1 is a schematic diagram of an improved high gain distributed amplifier according to the present invention.

Referring specifically to FIG. 1, a broad-band, high gain distributed amplifier 10 is shown including input transmission line 12, output transmission line 14, and amplifying elements 16, 18, and 20. As shown, amplifying elements 16 through 20 are coupled to transmission line 12 through inputs 21, 23 and 25, respectively, and coupled in parallel to output transmission line 14 through outputs 22, 24, and 26, respectively.

Input transmission line 12 comprises RF input 30, input inductors 32 spaced along input transmission line 12 on both sides of inputs 21, 23, and 25, and shunt input ground 34 comprising capacitor 36 and resistor 38. Shunt input ground 34 terminates unguided RF input signals (signals not received by inputs 21, 23, and 25) transmitted through input transmission line 12.

Amplifying elements 16, 18, and 20 are similar and may all be understood by describing element 16.

To increase the gain G of distributed amplifier 10 by increasing transconductance $g_m$, a darlington type amplifier 40 is coupled to input 21. Darlington type amplifier 40 comprises FET 42 having gate 43 coupled to input 21, source 44, and drain 45, and further comprises FET 46 having gate 47, source 48, and drain 49. Gate 47 is coupled to source 44, and drain 49 of FET 46 is coupled to drain 45 of FET 42. Source 48 of FET 46 is coupled to an electrical ground. Gate 47 is further coupled to first control voltage source 50.

A problem with darlington type amplifiers is the variance in gain and stability. To flaten out the gain, darlington type amplifier 40 is connected in cascade with FET amplifier 52. Shunt feedback 54 is also coupled to darlington type amplifier 40 to control contouring in the gain profile as well as assure unconditional stability.

Shunt feedback 54 comprises resistor 55 and capacitor 56. Shunt feedback 54 is coupled to drain 45 of FET 42 to receive feedback signals therefrom, and coupled to gate 43 of FET 42 to relay the feedback signal to darlington type amplifier 40.

A gate 57 of FET amplifier 52 is coupled through DC blocking cap (capacitor) 60 to drain 49 of FET 46 to receive the output from darlington type amplifier 40. A source 58 of FET amplifier 52 is terminated at ground, and a drain 59 is coupled to output 22 of amplifying element 16. Gate 57 is further coupled to a second control voltage source 61.

Figure 2:
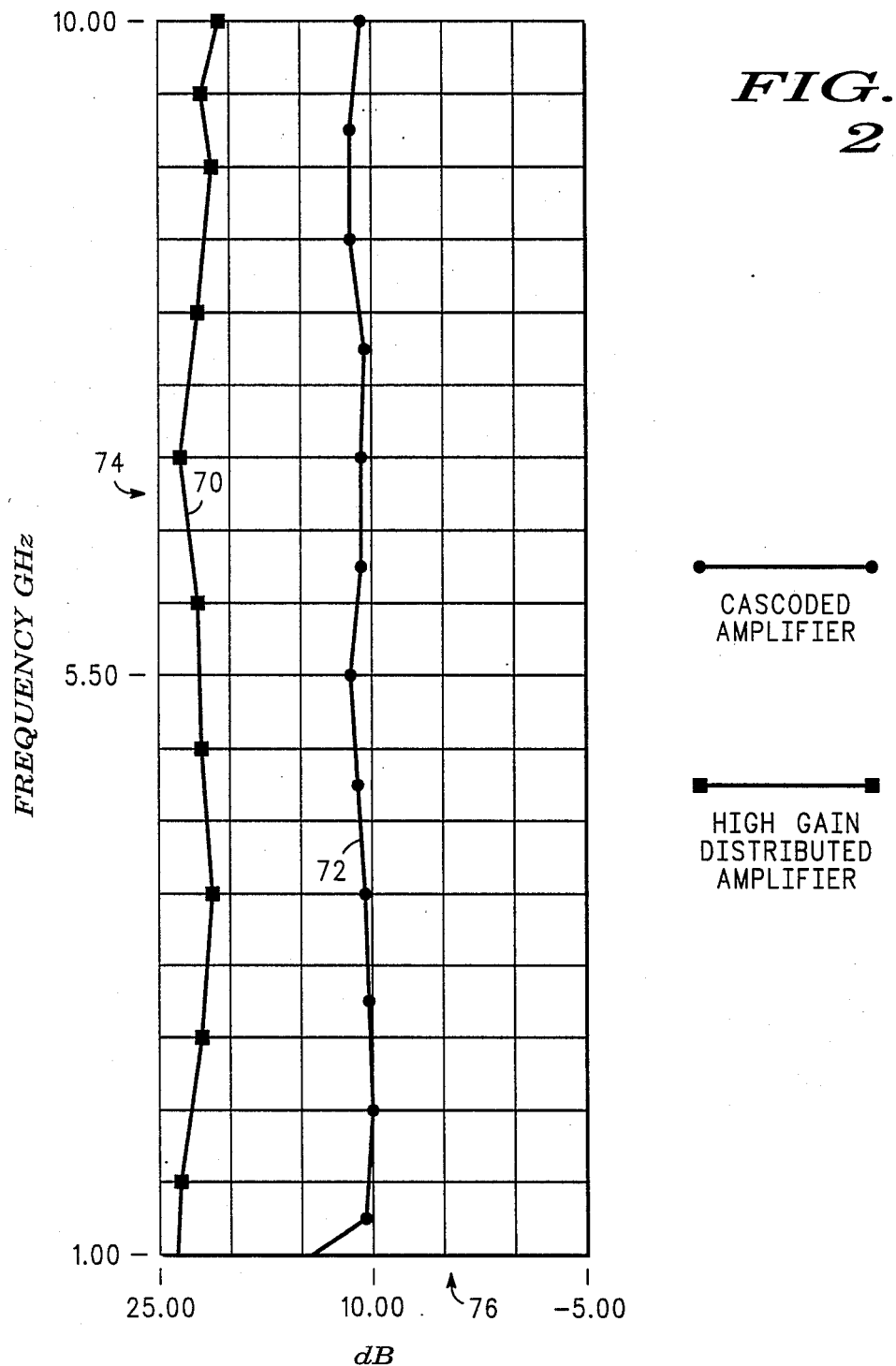
FIG. 2 is a graph showing gain versus frequency of the present invention as compared with conventional distributed amplifiers.

FIG. 2 shows the gain of high gain distributed amplifier 10 compared with the gain of a conventional distributed amplifier. The gain realized by distributed amplifier 10 is shown by line 70, while the gain for conventional distributed amplifiers, in this case, a cascoded amplifier, is shown by line 72. For reference, the X coordinate 74 of FIG. 2 represents frequency in gigahertz (GH$_z$) from 1.00 GH$_z$ to 10.00 GH$_z$, and the Y coordinate 76 represents decibals (dB) ranging from −5.00 dB to 25.00 dB. Conventional distributed amplifiers, line 72, have a gain of approximately 11 to 12 dB. High gain distributed amplifier 10 generally has a 1000% increase in gain over conventional distributed amplifiers with a gain in the range of approximately 20 to 24 dB.

Referring againg to FIG. 1, output transmission line 14 comprises output inductors 62 spaced along output transmission line 14 on both sides of outputs 22, 24, and 26, and amplifier output 64. Output transmission line 14 further comprises shunt output ground 66 coupled to output 22 through inductor 62. Shunt output ground 66 is coupled to ground and is comprised of capacitor 67 resistor 68 coupled in series along shunt output ground 66. Shunt output ground 66 terminates the unguided amplified signals from amplifying elements 16, 18, and 20 transmitted through output transmission line 14 and not collected at amplifier output 64.

When an RF signal is received at input 30, it is transmitted along input transmission line 12. Portions of the RF signal are received by amplifying elements 16, 18, and 20 (guided signals), while the remainder (unguided signals) are terminated at shunt input ground 34. The portions of the signal received by amplifying elements 16, 18, and 20 are amplified, recombined, and transmitted to amplifier output 64 through output transmission line 14. As with the input RF signal in input transmission line 12, portions of the amplified signals are not combined and output, but are unguided signals which are terminated at shunt output ground 66.

Figure 3:
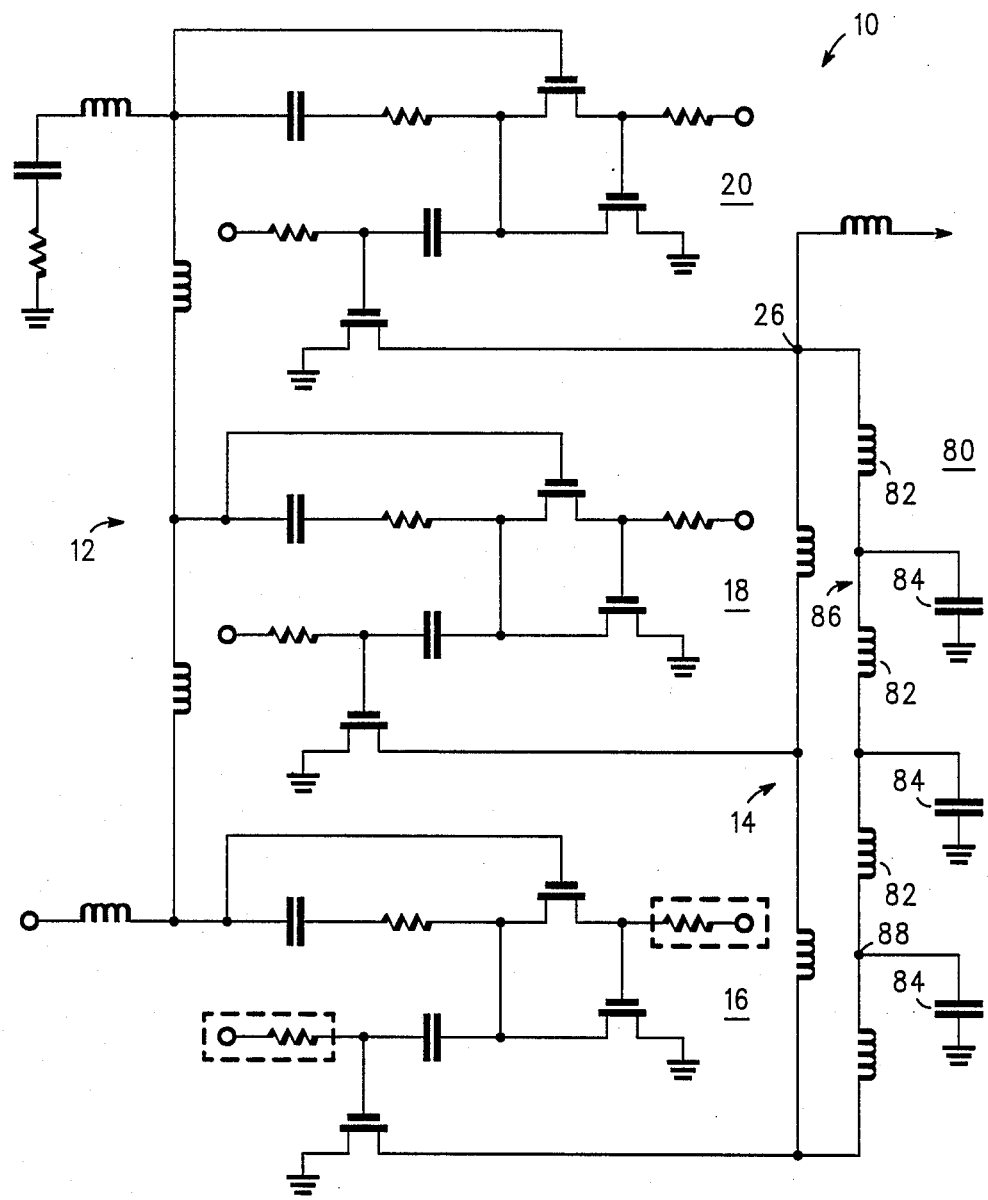
FIG. 3 is a schematic diagram of the improved high gain distributed amplifier having a time delay line to increase gain according to the present invention.

Approximately 3 dB is lost from amplifier 10 when the amplified unguided signals are terminated at shunt output ground 66. In most applications, high gain distributed amplifier 10 has sufficient gain and power output that the 3 dB loss through shunt output ground 66 is of minimal importance. Where the additional 3 dB is required, a time delay 80 may be added to amplifier 10 as shown in FIG. 3. Time delay 80 completely replaces shunt output ground 66, with time delay 80 coupled to output transmission line 14 between point 88 in place of shunt ouput ground 66, and at, or following output 26 of amplifying element 20.

Time delay 80 comprises delay inductors 82, delay capacitors 84, and delay line 86. Delay capacitors 84 and delay inductors 82 form a series of low pass filters along delay line 86 to permit recombining of unused power (unguided signals) within amplifying elements 16 through 20, thereby increasing the amplified second and third order intercept points.

As RF input signals are passed through amplifying elements 16 through 20, second and third order harmonics are created. These harmonics are modulated with the amplified signals causing spurious or sideband distortion in the output. Performance for amplifiers showing the effect of the modulated outputs are generally graphed according to performance tests of each given amplifier showing the fundamental amplified output having a 1:1 slope with m$^{th}$ order harmonics having m:1 slopes.

Figure 4:
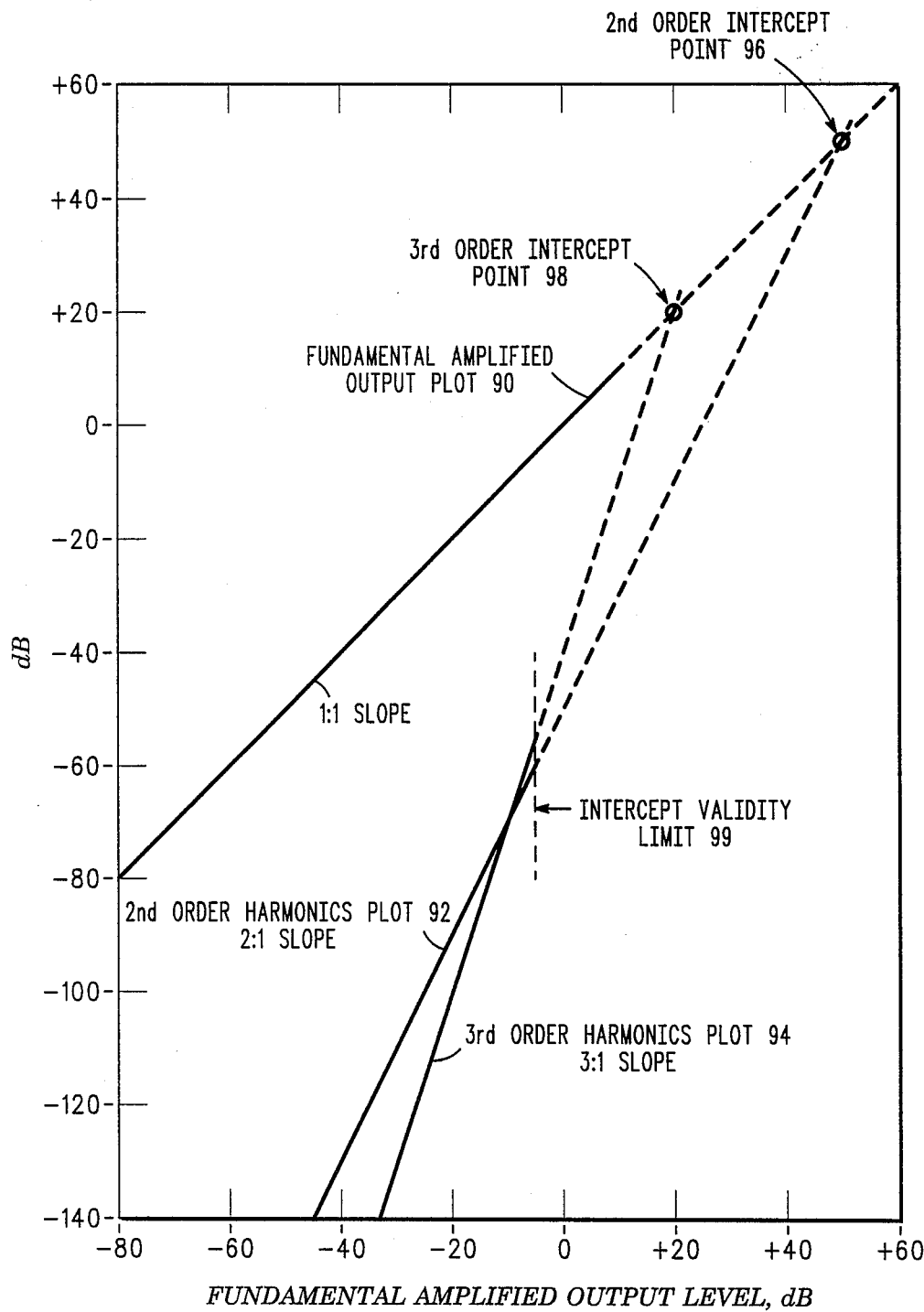
FIG. 4 is an intercept diagram showing fundamental output plotted with second and third order harmonics plots.

For instance, FIG. 4 shows fundamental amplified output plot 90 having a second order harmonics plot 92 and a third order harmonics plot 94 with 2:1 and 3:1 slopes respectively for a given amplifier. A second order intercept point 96 occurs where second order harmonics plot 92 intercepts fundamental amplified output plot 90. Correspondingly, a third order intercept point 98 occurs where fundamental amplified output plot 90 and third order harmonics plot 94 intercept. To determine second and third order harmonics, one can read from the graph the harmonics value at a given fundamental value. The intermodulation product of the fundamental amplified output and the m$^{th}$ order harmonics is given by $$P_m = I_m - m(I_m - S)$$

where $I_m$ is the m$^{th}$ order intercept in dB, and S is the signal level of fundamental amplified output plot 90 in dB. As indicated by both the intermodulation product equation and FIG. 4, the magnitude of the m$^{th}$ order harmonics is reduced as the m$^{th}$ order intercept point is increased. Intercept validity limit 99, as well as the dashed portion of fundamental amplified output plot 90, defines points beyond which emperical results are no longer linear, and are no longer "well behaved".

Time delay 80 operates to increase the m$^{th}$ order intercept points and thus decrease m$^{th}$ order harmonics for the entire distributed amplifier 10.

Unguided amplified signals from amplifying elements 16, 18, and 20 are collected at the end of time delay 80 near amplifying element 16, and are then recombined with the amplified guided signals along output transmission line 14 at or after output 26. In this manner, the 3 dB gain loss inherent with terminating transmission lines is retained in high gain distributed amplifier 10 to be output. The result is increased overall gain and increased power output.

It should be noted that time delay 80 is not limited to application with high gain distributed amplifier 10, but may be used to increase gain in any distributed amplifier having a terminating output transmission line. For instance, time delay 80 has been incorporated with distributed amplifiers other than cascaded darlington type amplifiers with increased amplifier gain of 3 dB.

Thus there has been provided, in accordance with the present invention, a high gain distributed amplifier that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A high gain distributed amplifier comprising:
   input transmission means for supplying an input signal;
   a plurality of darlington type amplifier means;
   a plurality of FET type amplifier means;
   one each of said plurality of FET type amplifier means coupled in series to a corresponding one of said plurality of darlington type amplifier means to form a plurality of cascaded elements;
   output transmission means;
   each of said cascaded elements including an input coupled in parallel to said input transmission means, and having an output coupled in parallel to said output transmission means;
   said plurality of darlington type amplifier means and said plurality of FET type amplifier means for amplifying said input signal; and
   said output transmission means for combining a first portion of said amplified signal from each of said cascaded elements to output said combined first portion of said amplified signal.

2. A high gain distributed amplifier according to claim 1 wherein each of said plurality of darlington type amplifier means comprises a RC feedback means for providing stability to said plurality of darlington type amplifier means, said RC feedback means coupled between a feedback port and an input of said plurality of darlington type amplifier means.

3. A high gain distributed amplifier according to claim 2 wherein said darlington type amplifier means further comprises:
   first FET means having a gate coupled to said input;
   second FET means having a gate coupled to a source of said first FET means;
   said gate of said second FET means further coupled to a voltage source;
   said feedback port of said darlington type means coupled to a drain of each of said first and second FET means; and
   said drain of said second FET means coupled to an output.

4. A high gain distributed amplifier according to claim 1 wherein the amplifier further comprises:
   time delay means for combining a second portion of said amplified signal with said combined first portion of amplified signal;
   said time delay means coupled in parallel with said output transmission means; and
   said time delay means including a first port coupled to a first port of said output transmission means, and a second port coupled to a second port of said output transmission means.

5. A high gain distributed amplifier according to claim 4 wherein said time delay means comprises means for increasing second and third order intercept points for said second portion of said amplified signal.

6. A high gain distributed amplifier according to claim 4 wherein said means for increasing second and third order intercept ports comprises a low pass filter means.

7. A method of increasing gain and power output within a distributed amplifier, said method comprising the steps of:
   feeding an RF (radio frequency) signal through a distributed amplifier to amplify said signal;
   collecting said amplified signal with an output transmission line, said amplified signal having a guided portion and an unguided portion;
   relaying said guided portion along said output transmission line to an output;
   relaying said unguided portion to a time delay line;
   transmitting said unguided portion along said time delay line to said output; and
   combining said unguided portion with said guided portion at said output.

8. A method of increasing gain and power output within a distributed amplifier according to claim 7 wherein said step of transmitting said unguided portion along said time delay line comprises the step of increasing second and third order intercept points to reduce spurious sideband signals.

9. A circuit to increase gain and power within a distributed amplifier having an output transmission line coupled to the outputs of the distributed amplifier, said circuit comprising:
   time delay means;
   said time delay means including a first end coupled to a first end of the output transmission line, and a second end coupled to a second end of the output transmission line; and
   said time delay means for receiving unguided amplified signals from said first end of said output transmission line to recombine said unguided amplified signals with guided amplified signals collected at said second end of said output transmission line.

10. A circuit to increase gain and power within a distributed amplifier having an output transmission line coupled to the outputs of the distributed amplifier according to claim 9, said time delay means comprising a means for increasing second and third order intercept points within the distributed amplifier.

11. A high gain distributed amplifier according to claim 10 wherein said means for increasing second and third order intercept ports comprises a low pass filter means.

* * * * *